United States Patent [19]

Hosaka et al.

[11] 4,123,721
[45] Oct. 31, 1978

[54] BIAS CURRENT COMPENSATED OPERATIONAL AMPLIFIER CIRCUIT

[75] Inventors: Akio Hosaka; Eiji Tsuruta, both of Yokohama, Japan

[73] Assignee: Nissan Motor Company, Limited, Japan

[21] Appl. No.: 752,181

[22] Filed: Dec. 20, 1976

[30] Foreign Application Priority Data

Dec. 27, 1975 [JP] Japan ................... 51-155773

[51] Int. Cl.$^2$ ............................. H03F 3/45
[52] U.S. Cl. ...................... 330/69; 330/107; 330/109; 330/146
[58] Field of Search ............ 330/69, 107, 109, 146

[56] References Cited

U.S. PATENT DOCUMENTS

| | | | |
|---|---|---|---|
| 3,617,919 | 11/1971 | Clark | 330/107 |
| 3,906,390 | 9/1975 | Rollett | 330/107 |
| 3,993,959 | 11/1976 | Boctor | 330/109 X |

OTHER PUBLICATIONS

Ritter — "Controlling the Op Amp with One Potentiometer", Electronics/Jul. 31, 1972; p. 78.

Primary Examiner—Lawrence J. Dahl
Attorney, Agent, or Firm—Robert E. Burns; Emmanuel J. Lobato; Bruce L. Adams

[57] ABSTRACT

Operational amplifier circuitry is provided which comprises an operational amplifier having a first input port and a second input port, and a compensating circuit for making a voltage difference between the first and the second input ports of the operational amplifier substantially equal to the offset voltage of the amplifier, compensating the bias currents of the operational amplifier. The compensating circuit may include a series of a first resistor and a second resistor connected between the first and the second input ports of the amplifier. The node connecting the first and the second resistors is coupled to a predetermined voltage, the resistances of the first and the second resistors being selected so that a voltage difference between the first and the second input ports of the amplifier is substantially equal to the offset voltage of the operational amplifier. A resistor may be connected between the first and the second input ports of the amplifier instead of the series of the first and the second resistors.

8 Claims, 9 Drawing Figures

BIAS CURRENT COMPENSATED OPERATIONAL AMPLIFIER CIRCUIT

FIELD OF THE INVENTION

This invention relates to operational amplifier circuitry, and particularly to circuitry for compensating for the bias currents of an operational amplifier.

BACKGROUND OF THE INVENTION

A prior art amplifier circuit including an operational amplifier has significant disadvantages caused by the bias currents of the operational amplifier, which are not negligible for circuit operation.

In a noninverting amplifier circuit composed of an operational amplifier, for example, input signals are applied to the noninverting input port of the amplifier through a resistance. The bias currents flowing from or to the noninverting input cause a voltage across the input resistance. The operational amplifier produces its output as if the voltage due to the bias currents were applied to the noninverting input port. If the input signal source has a high output impedance, accurate amplification of the input signals will not be expected.

With a conventional integration circuit using an operational amplifier, the bias currents of the amplifier make the voltage across a capacitor drift, which interconnects the output port with the inverting input port of the operational amplifier. Thus, the drift in capacitance voltage prevents the output integrated voltage of the amplifier from being kept constant even if the inverting input terminal is maintained open.

In a prior art amplifier circuit of high input impedance, the noninverting and inverting input terminals of the operational amplifier are respectively connected to the intermediate node of the respective voltage dividers, which are commonly coupled with the output port of the amplifier and the ground. It is well known to those skilled in the art that, in order to compensate for the bias currents of the amplifier, each of the resistors which respectively interconnect the noninverting and inverting input terminals to the ground are selected in such a fashion that the ratio of those resistances are equal to that of the associated bias currents of the amplifier. However, it is very difficult to determine the ratio of those bias currents since it is difficult to measure the bias currents which are on the order of several ten or several hundred nanoamperes.

SUMMARY OF THE INVENTION

It is accordingly an object of this invention to provide an improved operational amplifier circuit in which the bias currents are compensated so as to reduce the influence of such bias currents.

It is another object of this invention to provide a bias current compensated operational amplifier circuit simplified in circuit configuration and lower in cost without using a commercially high grade operational amplifier.

In accordance with this invention, operational amplifier circuitry comprises an operational amplifier having a first input port and a second input port, and compensating means for making a voltage difference between the first and the second input ports of the operational amplifier substantially equal to the offset voltage of the amplifier, thereby compensating the bias currents of the operational amplifier.

In accordance with one aspect of this invention, the compensating means mentioned above may comprise a series of a first resistor and a second resistor connected between the first and the second input ports of the operational amplifier, a node connecting the first and the second resistors being coupled to a predetermined voltage, the resistances of the first and the second resistors being selected so that a voltage difference between the first and the second input ports of the amplifier is substantially equal to the offset voltage of the operational amplifier.

In accordance with another aspect of this invention, a resistor may be connected between the first and the second input ports of the amplifier instead of the series of the resistors mentioned above. One of the first and the second input ports which is lower in voltage, is coupled to a predetermined voltage. The resistance of the resistor is selected so that a voltage across the resistor is substantially equal to the offset voltage of the amplifier, thereby compensating the bias currents of the operational amplifier.

An amplifier circuit or an integration circuit according to this invention may be incorporated in a deviation detector circuit and a control circuit provided with the output signals from an exhausted gas sensor, such as an $O_2$ sensor, in an air-fuel ratio controller for an engine, such as a feedback controller of an engine in accordance with exhausted gas component concentrations, providing an improved air-fuel ratio controller which is low in cost and high in availability.

BRIEF DESCRIPTION OF THE DRAWINGS

The objects and features of this invention will become more apparent from a consideration of the following detailed description and the drawings in which.

DESCRIPTION OF THE PREFERRED EMBODIMENT

Figure 1A:
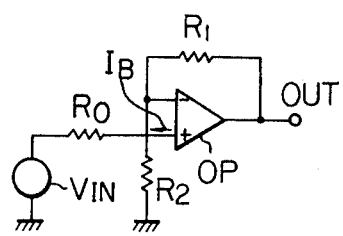
FIGS. 1A through 1C show prior art operational amplifier circuits in which the bias currents of the operational amplifiers are not compensated.

FIG. 1A shows a noninverting amplifier circuit in the prior art. An operational amplifier OP has a non-inverting input port (+) interconnected to a signal source $V_{IN}$ through a resistor $R_0$, and its output port OUT interconnected via a resistor $R_1$ to its inverting input port (−), which is grounded through a resistor $R_2$. Unless a bias current $I_B$ from the noninverting input port (+) of the operational amplifier OP is negligible, bias current $I_B$ causes a voltage $V_0 = R_0 \times I_B$ to appear on the noninverting terminal (+) of amplifier OP while the signal source voltage $V_{IN}$ is zero volts. The higher resistance $R_0$ would cause higher input voltage $V_0$ even if the bias current $I_B$ is negligibly small. Therefore, when the output impedance of the signal source $V_{IN}$ is very high, accurate amplification of the input signals will not be accomplished.

Figure 1B:
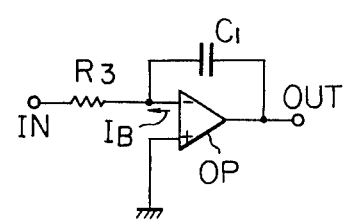

FIG. 1B shows a prior art integration circuit, in which an input terminal IN is interconnected to the inverting input port (−) of the operational amplifier OP through a resistor $R_3$, the output port OUT of the operational amplifier OP being interconnected to the inverting port (−) through a capacitor $C_1$. The noninverting input port (+) of the amplifier OP is grounded. The case will be considered that input terminal IN is kept open in order to maintain the output voltage constant. Assuming the leakage current of capacitor $C_1$ is negligibly small, the bias current $I_B$ causes the output voltage V from the output port OUT drift so as to be of the expression $dV/dt = I_B/C_1$, where $t$ is time. The output from the amplifier OP thus decreases gradually, so that the output will not be maintained constant for a long period of time.

Figure 1C:
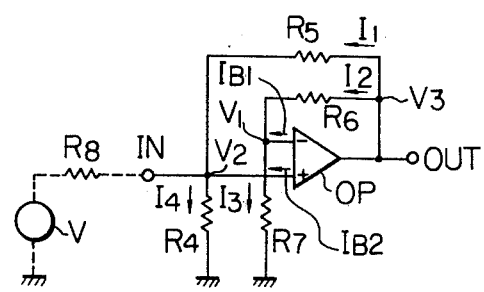

In FIG. 1C, an operational amplifier circuit in the prior art is shown. In the figure, an input terminal IN, which is connected to the noninverting input port (+) of an operational amplifier OP, is interconnected to one terminal of a resistor $R_4$ of which the other terminal is grounded. The output terminal OUT of the amplifier OP is coupled to resistors $R_5$ and $R_6$. Resistor $R_5$ is also coupled to the noninverting input port (+), and resistor $R_6$ to the inverting input port (−) and one terminal of a resistor $R_7$, of which the other terminal is connected to the ground. In the high input impedance circuit shown in FIG. 1C, assuming that the bias current $I_{B1}$ from the inverting input port (−) and the bias current $I_{B2}$ from the noninverting input port (+) are negligibly small, the voltage $V_1$ applied to the port (−) of the amplifier OP is $$V_1 = \frac{R_7}{R_6 + R_7} V_3$$

and the voltage $V_2$ to the noninverting terminal (+) thereof is $$V_2 = \frac{R_4}{R_4 + R_5} V_3$$

where $V_3$ is a voltage appearing at terminal OUT. While operational amplifier OP operates in its unsaturated condition, the input voltages $V_1$ and $V_2$ are substantially equal to each other. Therefore, from the above both expressions derived is the following relation:

$$\frac{R_7}{R_6} = \frac{R_4}{R_5} \tag{1}$$

In other words, the input voltages $V_1$ and $V_2$ are substantially mutually equal while resistors $R_4$ through $R_7$ satisfy expression (1).

Considering a signal source $V_{IN}$ interconnected to input terminal IN through a resistor $R_8$, the conditions satisfying the relation $V_1 = V_2$ will further be restricted. Now, taking into account the bias currents $I_{B1}$ and $I_{B2}$ from the inverting (−) and noninverting (+) input ports of operational amplifier OP, respectively, the input voltages $V_1$ and $V_2$ are $$V_1 = \frac{R_7}{R_6 + R_7} V_3 + I_{B1} R_7$$

$$V_2 = \frac{R_4}{R_4 + R_5} V_3 + I_{B2} R_4$$

When the voltages $V_1$ and $V_2$ are substantially equal to each other in spite of the value of the output voltage $V_3$, the following relation will be satisfied:

$$\frac{R_7}{R_6 + R_7} V_3 - \frac{R_4}{R_6 + R_5} V_3 = -I_{B1} R_7 + I_{B2} R_4 = 0$$

From those expressions there are derived above equation (1) also $$\frac{R_7}{R_6} = \frac{R_4}{R_5} \tag{1}$$

and the expression of $$\frac{R_7}{R_4} = \frac{I_{B2}}{I_{B1}} \tag{2}$$

Thus, both equations should concurrently be satisfied under the conditions of the infinitely high input impedance of the circuitry with bias currents $I_{B1}$ and $I_{B2}$ being taken into account. In practice, however, those bias currents are in the order of several tens or several hundreds nano-amperes. It is very difficult to accurately measure the value of the bias currents.

As discussed relative to the prior art as shown in FIGS. 1A through 1C, the bias currents of an operational amplifier affect in practice the circuitry resulting in various disadvantages. Of course, one can get some high grade operational amplifiers with very low bias currents, which are more expensive.

Figure 2:
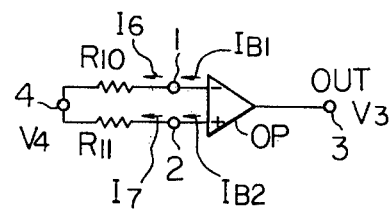
FIG. 2 is a basic circuit diagram helpful for understanding the operating principle of this invention.

FIG. 2 is a circuit diagram useful in explaining the principle of the present invention. In the circuit, the inverting input port 1 and the and noninverting input port 2 to an operational amplifier OP are connecting to each other through series resistors $R_{10}$ and $R_{11}$, which are compensatory resistors for compensating the bias currents to the operational amplifier OP. In FIG. 2, input voltages to the inverting and noninverting input ports 1 and 2 are $V_1$ and $V_2$, respectively, the output voltage appearing on output port OUT, or 3, is $V_3$, and the voltage on a node 4 connecting resistors $R_{10}$ and $R_{11}$ is $V_4$. To connecting node 4 a voltage may be applied for bias compensation by being fed back from the output port 3. It is assumed that the bias currents $I_{B1}$ and $I_{B2}$ are substantially constant in spite of the changes of voltage $V_4$ since the operational amplifier OP operates normally in its constant current region.

It will be assumed that no external circuits are connected to terminals 1 and 2 in the circuit shown in FIG. 2, then, $$V_1 = V_4 + I_6 R_{10} \tag{3}$$

$$V_2 = V_4 + I_7 R_{11} \tag{4}$$

$$V_3 = A(V_2 - V_1 - V_{OF}) \tag{5}$$

Where A is a gain factor of operational amplifier OP and $V_{OF}$ the amplifier offset voltage, which is a voltage difference $V_2 - V_1$ when $V_3 = 0$. In expression (5) gain factor A is normally more than $10^4$, which is assumed to be infinitely large as an approximation. Therefore, if the output of the operational amplifier is not saturated, i.e., output voltage $V_3$ is definite, then $$V_2 - V_1 - V_{OF} = 0 \tag{6}$$

Since no external circuits are connected to terminals 1 and 2, current $I_6$ through resistor $R_{10}$ is equal to the bias current $I_{B1}$ from the inverting input port (−) of the amplifier and current $I_7$ through resistor $R_{11}$ to the bias current $I_{B2}$ from the noninverting input port (+). Then there is obtained the following expression from above equations (3), (4) and (6):

$$V_2 - V_1 = I_{B2}R_{11} - I_{B1}R_{10} = V_{OF} \quad (7)$$

Now it is considered where either one of input terminals 1 and 2 has an external circuit connected. For example, if an external circuit is connected to terminal 2, then current $I_6$ is equal to bias current $I_{B1}$ and therefore, $$V_1 = V_4 + I_6R_{10} = V_4 + I_{B1}R_{10} \quad (8)$$

$$V_2 = V_4 + I_7R_{11} \quad (9)$$

If the external circuit thus coupled makes the output from the operational amplifier change, the feedback circuit operates so as to maintain the output unsaturated and therefore from equations (6), (8) and (9) obtained is the following expression:

$$V_2 - V_1 = V_{OF} = I_7R_{11} - I_{B1}R_{10} \quad (10)$$

Offset voltage $V_{OF}$ and bias current $I_{B1}$ are substantially constant because of the constant current operation of the operational amplifier, and hence comparison of equation (7) with equation (10) leads to $I_7 = I_{B2}$. Similarly, considering the case where only input terminal 1 has an external circuit coupled, there will be derived $I_6 = I_{B1}$. In other words, compensating resistors $R_{10}$ and $R_{11}$ can be selected as to resistance value so as to conduct therethrough the currents which are substantially equal to the bias currents, respectively.

In conclusion, if resistances $R_{10}$ and $R_{11}$ are selected so as to satisfy the relation $V_2 - V_1 = V_{OF}$, that is, the requirements of unsaturation of the operational amplifier, then the currents flowing through resistors $R_{10}$ and $R_{11}$ are substantially equal to the bias currents $I_{B1}$ and $I_{B2}$, respectively, without conducting the bias currents to the external circuit. It should be noted that the external circuit is coupled to either one of the two input terminals. This will remove the disadvantages that would be caused by the bias currents in an operational amplifier.

FIGS. 3A through 3D illustrate the embodiments in accordance with the present invention. In those figures, resistors $R_{10}$ and $R_{11}$ are the same as shown in FIG. 2, being resistors for compensating the bias currents of an operational amplifier. In each circuit shown in FIGS. 3A through 3D, the node 4 between the compensating resistors $R_{10}$ and $R_{11}$ is provided with a predetermined potential, such as a ground, and resistances $R_{10}$ and $R_{11}$ are selected so as to make the potential difference between the noninverting (+) and the inverting (−) input terminals of operational amplifier OP substantially equal to the offset voltage of the operational amplifier.

Figure 3A:
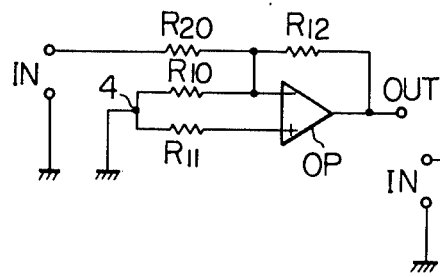
FIGS. 3A through 3D are circuit diagrams showing embodiments according to this invention.

FIG. 3A shows inverting amplifier circuitry, in which an external circuit including a resistor $R_{20}$ which interconnects the input terminal and the inverting input port (−). A resistor $R_{12}$ interconnects the inverting input port (−) and the output port OUT of an operational amplifier OP, input signals are applied between the ground and inverting input port (−).

Figure 3B:
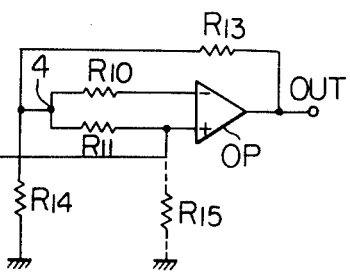

FIG. 3B shows noninverting amplifier circuitry, in which node 4 is provided with a voltage derived from a divider composed of resistors $R_{13}$ and $R_{14}$, the noninverting input terminal of the amplifier being provided with input signals. When resistances $R_{10}$ and $R_{11}$ are suitably selected in the fashion discussed above, the input impedance to the circuitry appears to be infinitely large. A resistor $R_{15}$ may be connected between the noninverting input port (+) and the ground in order to make the input impedance equal to resistance $R_{15}$.

Figure 3C:
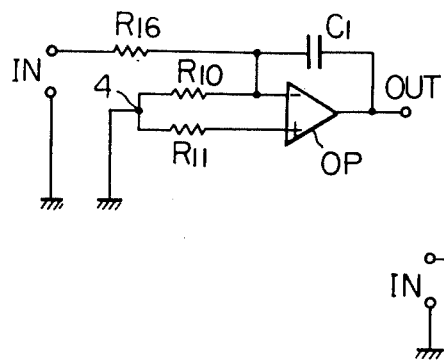

FIG. 3C illustrates integration circuitry in accordance with the present invention, in which a capacitor $C_1$ interconnects the inverting input terminal (−) and the output port OUT of an operational amplifier OP with input signals applied to the inverting terminal (−) through a resistor $R_{16}$. While input terminals IN are kept open, the output voltage, or the integral output, is held constant since current does not flow from capacitor $C_1$ to inverting input (−) or resistor $R_{10}$. Thus, any drift does not appear in this integration circuitry.

Figure 3D:
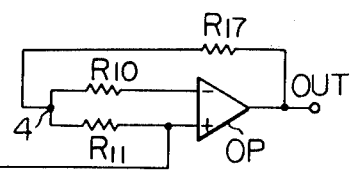

FIG. 3D shows voltage follower circuitry, wherein the potential to node 4 is fed back from the output port OUT of an operational amplifier OP via a resistor $R_{17}$, input signals being applied to the noninverting input terminal (+).

As can be seen from the circuitry shown in FIGS. 3A - 3D, the lead which would have been coupled to either one of the input terminals (−) and (+) is interconnected to node 4 between resistors $R_{10}$ and $R_{11}$. In FIG. 3B, for example, the terminal of resistor $R_{13}$ opposite to output port OUT of amplifier OP, which terminal would have been coupled to the inverting input port (−) in the circuit shown in FIG. 1A, is interconnected with the connecting node 4 of serial resistors $R_{10}$ and $R_{11}$.

Figure 4:
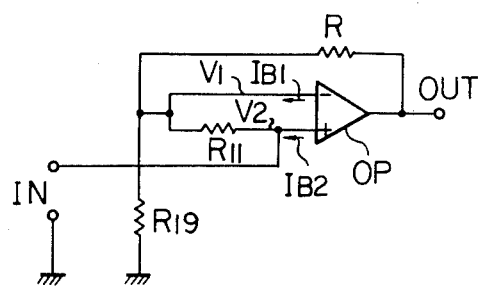
FIG. 4 illustrates a circuit diagram showing another embodiment according to this invention.

Under the conditions in which the relation $V_2 - V_1 = V_{OF}$ is maintained, resistor $R_{10}$ may be omitted since voltage $V_2$ at the noninverting input port (+) is higher than voltage $V_1$ at the inverting port (−) by offset voltage $V_{OF}$ while bias current $I_{B2}$ is flowing from the noninverting input port (+) through resistor $R_{11}$. Therefore, circuitry in accordance with the present invention from which resistor $R_{10}$ is omitted is shown in FIG. 4. This circuitry is a noninverting amplifier similar to the one illustrated in FIG. 3B. In FIG. 4 the divided potential appearing between resistors $R_{18}$ and $R_{19}$ connected in series is directly coupled to the inverting input terminal (−) of an operational amplifier OP, resistor $R_{11}$ interconnecting both input terminals (−) and (+) of the amplifier, input signals being applied to the noninverting input port (+) as shown. Thus, taking into account both the sign and magnitude of offset voltage $V_{OF}$ and the directions of bias currents $I_{B1}$ and $I_{B2}$, which directions depend upon the polarities of the transistors included in the operational amplifier, either one of the compensating resistors $R_{10}$ and $R_{11}$ may be omitted.

While this invention has been described in terms of specific illustrative embodiments, it is to be understood to be susceptible of modification by those skilled in the art within the spirit and scope of the appended claims.

What is claimed is:

1. Operational amplifier circuitry comprising:
   first and second input terminals for receiving an input signal, said second input terminal being connected to ground;
   an operational amplifier having first and second input terminals and an output terminal, means connecting one of said first and second input terminals of said operational amplifier for said operational amplifier to receive said input signal from said first input terminal;
   a junction;
   means for determining a predetermined electric potential of said junction relative to ground; and
   first and second resistors each respectively having first and second terminals, said first terminal of said first resistor being connected to said first input terminal of said operational amplifier, said first terminal of said second resistor being connected to said second input terminal of said operational amplifier, said second terminals of said first and second resistors being connected to said junction, the value of the resistances of said first and second resistors being selected and fixed to develop a voltage difference between said first and second input terminals of said operational amplifier substantially equal to the offset voltage of said operational amplifier, thereby compensating for bias currents of said operational amplifier.

2. Operational amplifier circuitry as claimed in claim 1, wherein said means for determining a predetermined electric potential is a conductor connected across said junction and ground.

3. Operational amplifier circuitry as claimed in claim 1, wherein said means for determining a predetermined electric potential is a feedback resistor connected across said junction and the output terminal of said operational amplifier.

4. Operational amplifier circuitry as claimed in claim 3, wherein said means for determining a predetermined electric potential further comprises a resistor interposed between said junction and ground.

5. Operational amplifier circuitry as claimed in claim 4, further comprising a resistor interposed between said first input terminal and ground.

6. Operational amplifier circuitry as claimed in claim 1, wherein said first input terminal is connected to one of said first and second input terminals of said operational amplifier.

7. Operational amplifier circuitry as claimed in claim 1, a resistor connected between said first input terminal and one of said first and second input terminals of said operational amplifier.

8. Operational amplifier having first and second input terminals and an output terminal, said second input terminal of said operational amplifier being connected to said first input terminal, the voltage at the first input terminal of said operational amplifier being higher than that at the second input terminal of said operational amplifier, the directions of the bias currents through the first and second input terminals of said operational amplifier being away therefrom;

a junction;

means for determining a predetermined electric potential of said junction relative to ground;

a conductor interposed between said first input terminal of said operational amplifier and said junction; and a resistor interposed between said second input terminal of said operational amplifier and said junction, the resistance values of said resistor being selected and fixed to develop a voltage difference between said first and second input terminals of said operational amplifier substantially equal to the offset voltage of said operational amplifier, thereby compensating for bias currents of said operational amplifier.

* * * * *